(12) United States Patent
Lin et al.

(10) Patent No.: US 10,186,454 B2
(45) Date of Patent: Jan. 22, 2019

(54) SEMICONDUCTOR STRUCTURE HAVING ETCH STOP LAYER AND METHOD OF FORMING THE SAME

(71) Applicant: TAIWAN SEMICONDUCTOR MANUFACTURING CO., LTD., Hsinchu (TW)

(72) Inventors: Cheng-Han Lin, Tainan (TW); Han-Sheng Weng, Tainan (TW); Chao-Ching Chang, Kaohsiung (TW); Jian-Shin Tsai, Tainan (TW); Yi-Ming Lin, Tainan (TW); Min-Hui Lin, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/623,481

(22) Filed: Jun. 15, 2017

(65) Prior Publication Data

US 2018/0366369 A1    Dec. 20, 2018

(51) Int. Cl.
| | |
|---|---|
| H01L 21/20 | (2006.01) |
| H01L 21/469 | (2006.01) |
| H01L 23/12 | (2006.01) |
| H01L 21/768 | (2006.01) |
| H01L 23/535 | (2006.01) |
| H01L 23/48 | (2006.01) |
| H01L 23/532 | (2006.01) |
| H01L 21/02 | (2006.01) |

(52) U.S. Cl.
CPC .. *H01L 21/76834* (2013.01); *H01L 21/02274* (2013.01); *H01L 21/76832* (2013.01); *H01L 21/76895* (2013.01); *H01L 21/76898* (2013.01); *H01L 23/481* (2013.01); *H01L 23/535* (2013.01); *H01L 23/53214* (2013.01); *H01L 23/53228* (2013.01); *H01L 23/53233* (2013.01); *H01L 23/53242* (2013.01); *H01L 23/53257* (2013.01); *H01L 23/53261* (2013.01); *H01L 23/53295* (2013.01)

(58) Field of Classification Search
CPC ......... H01L 21/76834; H01L 21/76835; H01L 21/76832
USPC .......................... 438/485, 778; 257/701, 702
See application file for complete search history.

(56) References Cited

U.S. PATENT DOCUMENTS

| | | | |
|---|---|---|---|
| 7,910,897 B2* | 3/2011 | Schmitt | H01L 21/76801 250/453.11 |
| 8,207,567 B2* | 6/2012 | Chin | H01L 23/5223 257/303 |
| 2005/0042889 A1* | 2/2005 | Lee | C23C 16/30 438/780 |
| 2017/0194243 A1* | 7/2017 | Wu | H01L 23/528 |

\* cited by examiner

*Primary Examiner* — Hsien Ming Lee
(74) *Attorney, Agent, or Firm* — McClure, Qualey & Rodack, LLP

(57) ABSTRACT

A semiconductor structure includes a first dielectric layer, a first conductive via, a second conductive via and an etch stop layer. The first conductive via and the second conductive via are respectively disposed in the first dielectric layer. The etch stop layer is disposed on the first dielectric layer and contacts the first and second conductive vias. The etch stop layer includes nitrogen-and-oxygen-doped silicon carbide (NODC).

19 Claims, 10 Drawing Sheets

SEMICONDUCTOR STRUCTURE HAVING ETCH STOP LAYER AND METHOD OF FORMING THE SAME

BACKGROUND

Performance improvements of integrated circuits (ICs) are typically achieved by device miniaturization, and the device miniaturization concurrently results in increasing packaging density of the formed ICs. Methods and materials applied for interconnecting ICs are therefore becoming an increasingly more important part of forming packaged semiconductor devices.

The selection of materials (e.g. dielectrics and/or metals) used for the formation of the interconnect structure continue to be explored as a part of a continuing effort to improve device performance. An etch stop layer is usually disposed overlying conductive features (e.g. a conductive via) in a semiconductor structure such as the interconnect structure. However, the conventional material used to form the etch stop layer is not suitable for various conductive features due to poor adhesion between the etch stop layer and some of the materials (e.g. copper) of the conductive features. Therefore, there is a need to develop a semiconductor structure having an etch stop layer and a method of forming the same to tackle the problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
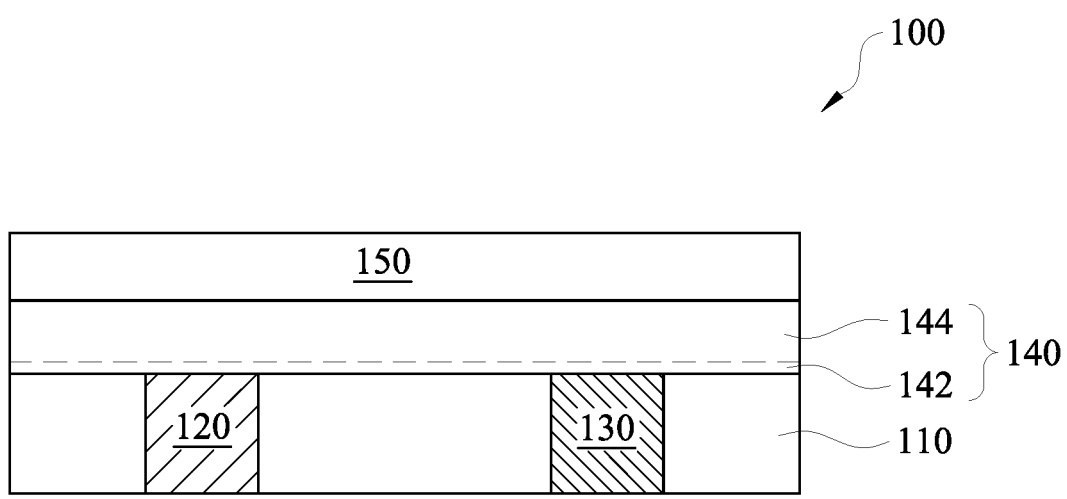
FIG. 1 is a schematic section-cross view of a semiconductor structure having an etch stop layer in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An etch stop layer (ESL) is used as a protection layer for the underlying features during a semiconductor fabricating process. Furthermore, the etch stop layer may be also used as an adhesive layer between two layers such as two dielectric layers, in which one of the dielectric layers may include one or more conductive features (e.g. a conductive via) therein. However, a common etch stop layer formed from oxygen-doped silicon carbide (ODC) has poor adhesion to some metallic materials such as copper, and another common etch stop layer formed from nitrogen-doped silicon carbide (NDC) has poor adhesion to some dielectric layers (e.g. hard black diamond (HBD)). In addition, there is a technique combining the ODC and NDC as a double-layered etch stop layer, however, more processes are required to obtain such structure, leading to increasing costs. Accordingly, a single-layered etch stop layer having improved adhesion to both metallic materials and dielectric layers is provided.

Embodiments of the present disclosure are directed to providing a semiconductor structure having an etch stop layer and a method of forming the semiconductor structure. The etch stop layer includes oxygen-and-nitrogen-doped silicon carbide (NODC), in which nitrogen atoms are mainly distributed in a first portion of the etch stop layer and bind to metal atoms in a conductive via. The formation of the etch stop layer includes a pre-treatment of nitrogen-containing gas (referred as a nitrogen pre-treatment hereinafter) performed on a surface of the conductive via before a silicon-containing gas and an oxygen containing gas are treated on the surface of the conductive via. Accordingly, adhesion between the etch stop layer and the conductive via formed by various metallic materials and/or adhesion between the etch stop layer and the dielectric layers may be improved.

Referring to FIG. 1, FIG. 1 is a schematic section-cross view of a semiconductor structure having an etch stop layer in accordance with some embodiments of the present disclosure. As shown in FIG. 1, a semiconductor structure 100 includes a first dielectric layer 110, a first conductive via 120, a second conductive via 130 and an etch stop layer 140. The first and second conductive vias 120 and 130 are respectively disposed in the first dielectric layer 110. The etch stop layer 140 is disposed on the first dielectric layer 110 and contacts the first and second conductive vias 120 and 130. The etch stop layer 140 includes nitrogen-and-oxygen-doped silicon carbide (NODC). In some embodiments, the semiconductor structure 100 may further include a second dielectric layer 150.

In some embodiments, the first dielectric layer 110 is formed from a material such as phosphosilicate glass (PSG), fluorosilicate glass (FSG), undoped silicate glass (USG), hard black diamond (HBD), extreme low k (ELK) dielectrics, high-stress undoped silicate glass (HSUSG) or a combination thereof. In a certain example, the first dielectric layer 110 is formed from PSG.

In some embodiments, the first conductive via 120 and the second conductive via 130 are formed by different metallic materials. For example, a material forming the first conductive via 120 includes tungsten (W), tungsten-based alloys, copper (Cu), copper-based alloys or combinations thereof. For example, a material forming the second conductive via 130 includes copper, copper-based alloy, tungsten, aluminum (Al), gold (Au), silver (Ag) or a combination thereof. In certain examples, the first conductive via 120 is formed from tungsten, and the second conductive via 130 is formed from copper. In other embodiments, the first and second conductive vias 120 and 130 may be formed by the same metallic materials mentioned above.

In some embodiments, the etch stop layer 140 has a first portion 142 and a second portion 144, in which the second portion 144 is disposed on the first portion (i.e. the first portion 142 is disposed between the second portion 144 of the etch stop layer 140 and the first/second conductive vias 120/130). The first portion 142 is defined as a portion of the etch stop layer 140 having a thickness substantially no more than 20 Å from top surfaces of the first dielectric layer 110, the first conductive via 120 and the second conductive via 130. In some embodiments, a nitrogen content of the first portion 142 is greater than a nitrogen content of the second portion 144. The nitrogen atoms of the first portion 142 may bind to metal atoms of the metallic materials of the first and the second conductive vias 120 and 130. Particularly, the nitrogen atoms of the first portion 142 may bind to copper atoms. That is, the first portion 142 is mainly formed from NODC to have good adhesion to the conductive vias, and the second portion 144 may be formed from oxygen-doped silicon carbide (ODC) to have good adhesion to a dielectric layer (e.g. the second dielectric layer 150). In some embodiments, the nitrogen content of the first portion 142 is in a range substantially from 5 atomic percent (at. %) to 10 at. %. When the nitrogen content is smaller than 5 at. %, the etch stop layer 140 has poor adhesion to copper. On the other hand, when the nitrogen content is greater than 10 at. %, the etch stop layer 140 may have poor adhesion to the second dielectric layer 150.

In some embodiments, a material forming the second dielectric layer 150 includes PSG, FSG, USG, HBD, ELK dielectrics, HSUSG or a combination thereof. In some embodiments, the first and second dielectric layer 110 and 150 may include the same material(s). In alternative embodiment, the first and second dielectric layer 110 and 150 may respectively include different materials. In certain examples, the material forming the first dielectric layer 110 includes PSG, and the material forming the second dielectric layer 150 includes HBD.

Figure 2A:
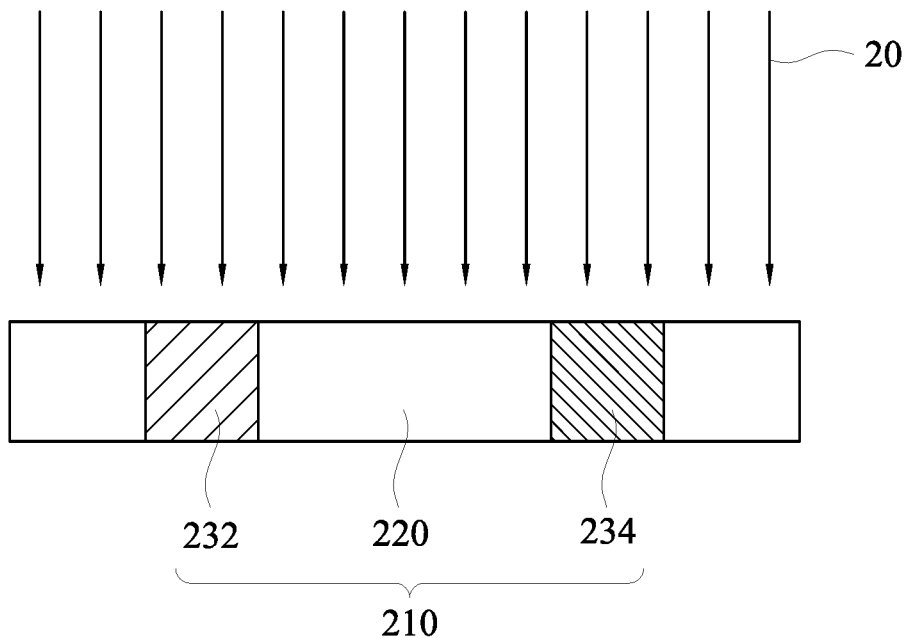
FIG. 2A through FIG. 2E are schematic section-cross views of intermediate stages showing a method for forming a semiconductor structure having an etch stop layer in accordance with various embodiments of the present disclosure.

Referring to FIG. 2A through FIG. 2E, FIG. 2A through FIG. 2E are schematic section-cross views of intermediate stages showing a method for forming a semiconductor structure having an etch stop layer in accordance with various embodiments of the present disclosure. As shown in FIG. 2A, a structure 210 including a first dielectric layer 220, a first conductive via 232 and a second conductive via 234 is provided. A first conductive via 232 and a second conductive via 234 are disposed in the first dielectric layer 220. In some embodiments, a material forming the first dielectric layer 220 includes PSG, FSG, USG, HBD, ELK dielectrics, HSUSG or a combination thereof. In certain examples, the material forming the first dielectric layer 220 is PSG. In some embodiments, a material forming the first conductive via 232 may include tungsten, tungsten-based alloys, copper, copper-based alloys or combinations thereof. In alternative embodiments, a material forming the second conductive via 234 includes copper, copper-based alloy, tungsten, aluminum, gold, silver or a combination thereof. In certain examples, the first conductive via 232 may be formed from tungsten, and the second conductive via 234 may be formed from copper. Then, a plasma assisted deposition process is performed on a surface of the structure 210. In some embodiments, the plasma-assisted deposition process is a plasma-enhanced chemical vapor deposition (PECVD) process. The plasma assisted deposition process may include a nitrogen pre-treatment 20 shown in FIG. 2A and an operation 22 shown in FIG. 2C. Detailed descriptions are provided as follows.

As shown in FIG. 2A, the nitrogen pre-treatment 20 is performed, in which a nitrogen-containing gas flows over the surface of the structure 210 (i.e. top surfaces of the first dielectric layer 220, the first conductive via 232 and the second conductive via 234) for a predetermined duration. In some embodiments, the predetermined duration is substantially not smaller than 15 seconds. In alternative examples, the predetermined duration is in a range substantially from 15 seconds to 20 seconds. When the predetermined duration is smaller than 15 seconds, free radicals are generated on the top surfaces of the first and second conductive vias 232 and 234 (especially when the conductive vias contain copper), leading to undesired oxidation of the top surface and poor conductivity of the first and second conductive vias 232 and 234. In some embodiments, the nitrogen-containing gas includes ammonia ($NH_3$).

Figure 2B:
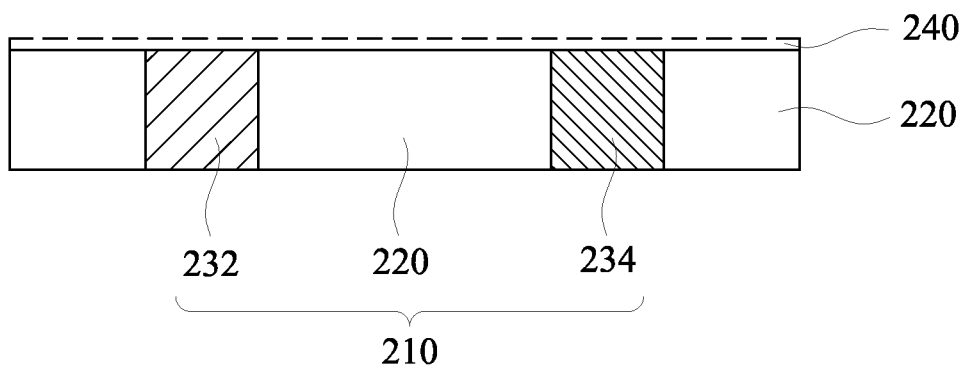

As shown in FIG. 2B, after the nitrogen pre-treatment 20 is performed, a pre-layer 240 may be formed on the structure 210. The pre-layer 240 may be regarded as a layer of the nitrogen-containing gas from the nitrogen pre-treatment 20 in FIG. 2A, in which the nitrogen-containing gas is distributed around the surface of the structure 210 while may or may not reacted with atoms distributed in/on the surface at the present process intermediate stage. The pre-layer 240 may become a portion of an etch stop layer described later by reacting the nitrogen-containing gas of the pre-layer 240 with other reactant gases.

Figure 2C:
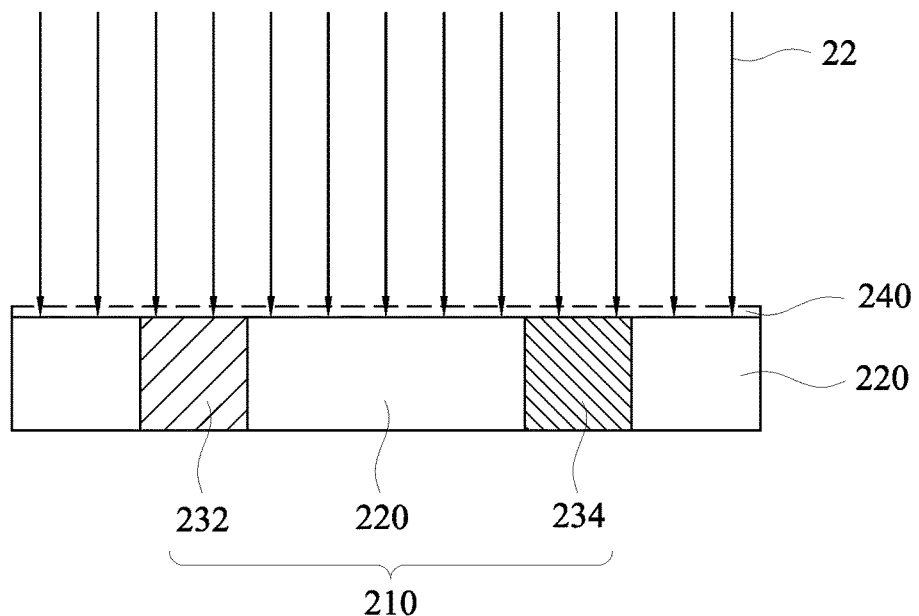
Figure 2D:
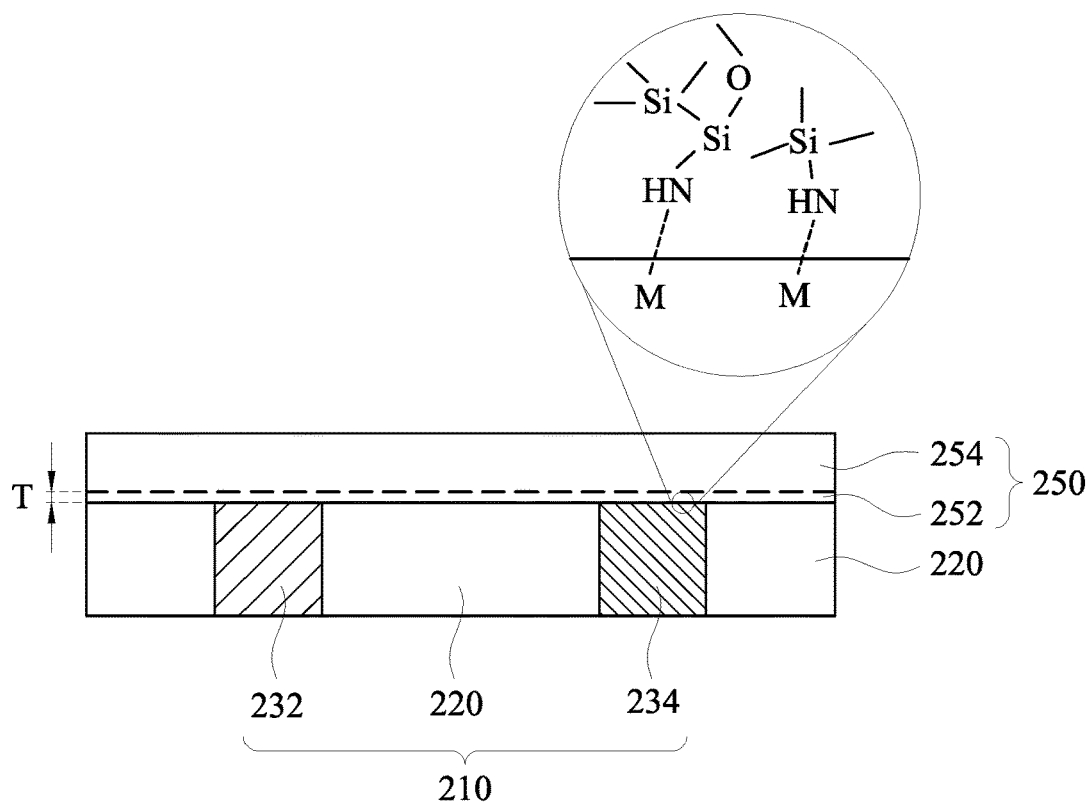

Then, as shown in FIG. 2C, the operation 22 is performed on the surface of the structure 210, thereby forming an etch stop layer 250 as shown in FIG. 2D. The operation 22 includes flowing a silicon-containing gas and an oxygen-containing gas over the structure 210. In some embodiments, the silicon-containing gas includes tetramethylsilane (Si($CH_3$)$_4$), trimethylsilane (SiH($CH_3$)$_3$) or a combination thereof. In some embodiments, the oxygen-containing gas includes carbon dioxide ($CO_2$), oxygen ($O_2$) or a combination thereof. In some embodiments, the etch stop layer 250 has a first portion 252 and a second portion 254 disposed on the first portion 252.

A formation of the etch stop layer 250 is described as follows. When the silicon-containing gas and the oxygen-containing gas are applied to the surface of the structure 210 during the operation 22 (FIG. 2C), the nitrogen-containing gas of the pre-layer 240 is reacted with the silicon-containing gas and the oxygen-containing gas under a plasma-assisted environment, thereby forming the first portion 252, which is mainly formed from nitrogen-and-oxygen-doped silicon carbide (NODC). Then, the silicon-containing gas and the oxygen-containing gas continually flows, the second portion 254 of the etch stop layer 250 is then formed on the first portion 252, in which the second portion 254 of the etch stop layer 250 includes oxygen-doped silicon carbide (ODC). In some embodiments, the nitrogen content of the first portion 252 is greater than the nitrogen content 254. That is, the nitrogen atoms in the etch stop layer 250 are not uniformly distributed but gradually distributed. Generally, the nearer to the surface of the structure 210, the higher the nitrogen content.

The first portion 252 is defined as a portion of the etch stop layer 250 which has a thickness T substantially no more than 20 Å from the top surfaces of the structure 210. In some embodiments, the nitrogen content of the first portion 252 is in a range substantially from 5 at. % to 10 at. %. When the nitrogen content is smaller than 5 at. %, the etch stop layer 140 has poor adhesion to copper. On the other hand, when the nitrogen content is greater than 10 at. %, the nitrogen atoms may distribute in an interface between the etch stop layer 250 and an dielectric layer over the etch stop layer formed by subsequent processes, and the etch stop layer 250 may have poor adhesion to the dielectric layer (e.g. the second dielectric layer 260 of FIG. 2E).

In some embodiments, the etch stop layer 250 (or the first portion 252) may include a complex or a compound containing nitrogen, silicon and oxygen. In certain examples, the compound may include $NSiCO_3$, $N_2SiCO_2$, $N_3SiCO_3$ or a combination thereof.

FIG. 2D provides an enlarged view between the first portion 252 of the etch stop layer 250 and the second conductive via 234. As shown in the enlarged view, the first portion 252 includes NODC. Furthermore, the nitrogen atoms of the etch stop layer 250 bind to the metal atoms in the first and/or second conductive vias 232 and 234. Accordingly, the nitrogen atoms from the nitrogen pre-treatment 20 of FIG. 2A improves adhesion between the etch stop layer 250 and the structure 210, especially the adhesion between the etch stop layer 250 and the first/second conductive vias 232/234. The chemical structure in FIG. 2D is only for illustration, and other chemical structures may be formed in the etch stop layer 250. In certain examples, both the nitrogen pre-treatment 20 of FIG. 2A and the operation 22 of FIG. 2C may be performed at 400° C. In certain examples, the plasma may be provided by a high frequency radio frequency (HFRF) power of, for example, 5000 W. When the nitrogen pre-treatment 20 of FIG. 2A and the operation 22 of FIG. 2C are not performed under the plasma-assisted process, a reaction among the nitrogen-containing gas, the silicon containing gas and the oxygen containing gas does not occur, and thus the etch stop layer 250 may not be formed.

It is noted that the nitrogen pre-treatment 20 and the operation 22 cannot be performed at the same time, and the nitrogen pre-treatment 20 cannot be performed after the operation 22. If so, the nitrogen atoms were uniformly distributed in the etch stop layer, causing poor adhesion to the dielectric layer formed by subsequent processes.

Figure 2E:
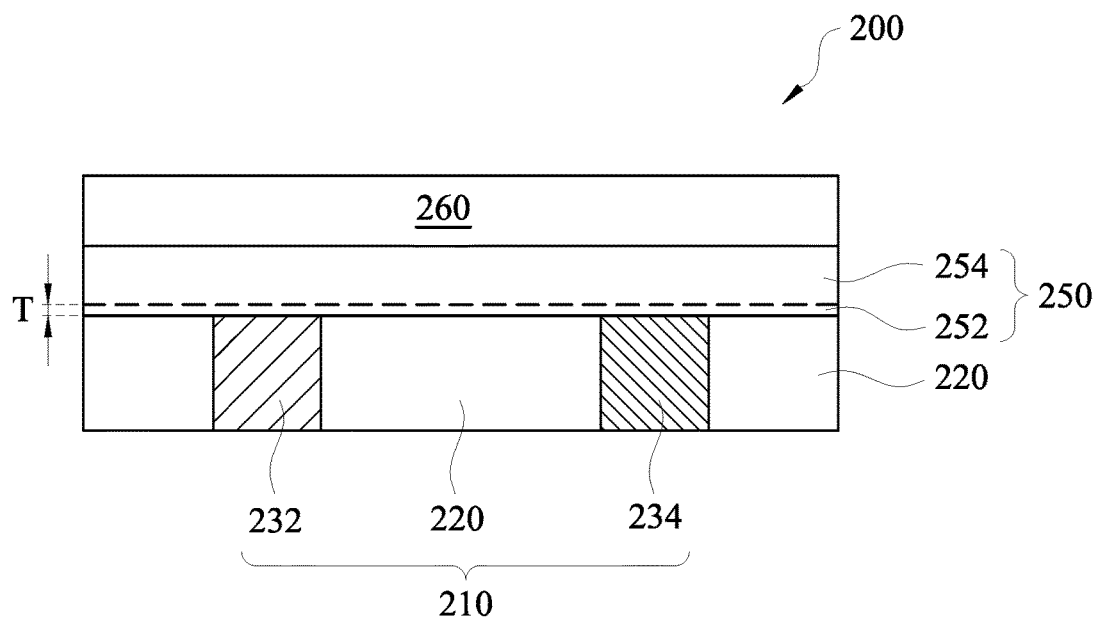

Next, as shown in FIG. 2E, a second dielectric layer 260 may be deposited over the etch stop layer 250, thereby forming a semiconductor structure 200. A material forming the second dielectric layer 260 includes PSG, FSG, USG, HBD, ELK dielectrics, HSUSG or a combination thereof. In some embodiments, the first and second dielectric layer 220 and 260 may include the same material(s). In alternative embodiment, the first and second dielectric layer 220 and 260 may respectively include different materials. In certain examples, the material forming the second dielectric layer 260 includes HBD. In some embodiments, the dielectric layer 260 may be deposited by suitable deposition process such as chemical vapor deposition (CVD), physical vapor deposition (PVD), atomic layer deposition (ALD), or the like. In some embodiments, the semiconductor structure 200 may be used as an interconnect structure to connect two devices.

Figure 3:
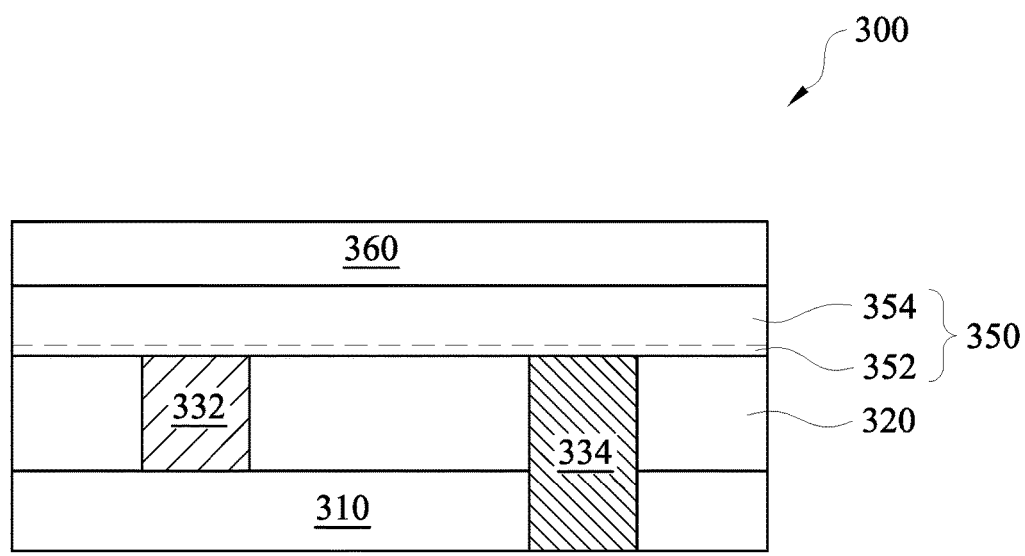
FIG. 3 is a schematic section-cross view showing a semiconductor structure having an etch stop layer in accordance with some embodiments of the present disclosure.

FIG. 3 is a schematic section-cross view showing a semiconductor structure having an etch stop layer in accordance with some embodiments of the present disclosure. As shown in FIG. 3, the semiconductor structure 300 includes a substrate layer 310, a first dielectric layer 320, a tungsten conductive via 332, a copper conductive via 334 and an etch stop layer 350. The first dielectric layer 320 is disposed on the substrate layer 310. The tungsten conductive via 332 is disposed in the first dielectric layer. The copper conductive via 334 is disposed in the first dielectric layer and extends through the substrate layer 310. The etch stop layer 350 is disposed on the first dielectric layer 320 and contacts the tungsten conductive via 332 and the copper conductive via 334. The etch stop layer 350 includes NODC. The etch stop layer 350 has a first portion 352 and a second portion 354 disposed on the first portion 352, and a nitrogen content of the first portion 352 is greater than a nitrogen content of the second portion 354.

In some embodiments, the substrate 310 is typically silicon (Si), for example, a silicon substrate with or without an epitaxial layer, or a silicon-on-insulator substrate containing a buried insulator layer. In further embodiments, the substrate 310 has a front surface (the side has the first dielectric layer 320 thereon) and a back surface, and some conductive features may be formed in/on the front surface. The conductive features (not shown) may include multiple individual circuit elements such as transistors, diodes, resistors, capacitors, inductors, and other active and passive semiconductor devices formed by conventional processes known in the integrated circuit manufacturing art. In some embodiments, the tungsten conductive via 332 may be electrically connected to the conductive features.

The copper conductive via 334 is formed by filling copper into a via, and the tungsten conductive via 332 is formed by filling tungsten into a via. The first dielectric layer 320, the first portion 352 and the second portion 354 of the etch stop layer 350 of FIG. 3 are similar to the first dielectric layer 110, the first portion 142 and the second portion 144 of the etch stop layer 140 of FIG. 1 and may not be repeated herein. In some embodiments, the semiconductor structure 300 further includes a second dielectric layer 360, which is similar to the second dielectric layer 150 of FIG. 1 and may not be repeated herein.

In some embodiments, the copper conductive via 334 is exposed from the back surface of the substrate layer 310 for a sensing purpose. In alternative embodiments, the exposed copper conductive via 334 may be covered by another dielectric layer (not shown) for connecting the semiconductor structure 300 to another semiconductor structure or device (not shown).

Figure 4A:
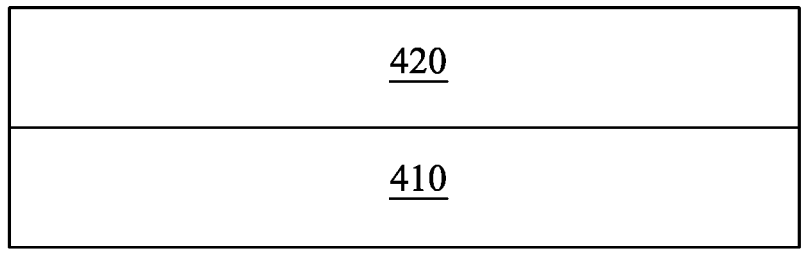
FIG. 4A through FIG. 4J are schematic section-cross views of intermediate stages showing a method for forming a semiconductor structure having an etch stop layer in accordance with various embodiments of the present disclosure.

FIG. 4A through FIG. 4J are schematic section-cross views of intermediate stages showing a method for forming a semiconductor structure having an etch stop layer in accordance with various embodiments of the present disclosure. Referring to FIG. 4A, a substrate layer 410 having a first dielectric layer 420 thereon is provided. The first dielectric layer 420 may be deposited on the substrate layer 410 by a suitable process such as CVD, PVD, ALD or the like. The substrate layer 410 and the first dielectric layer 420 of FIG. 4A are similar to the substrate 310 and the first dielectric layer 320 of FIG. 3 and may not be repeated herein.

Figure 4B:
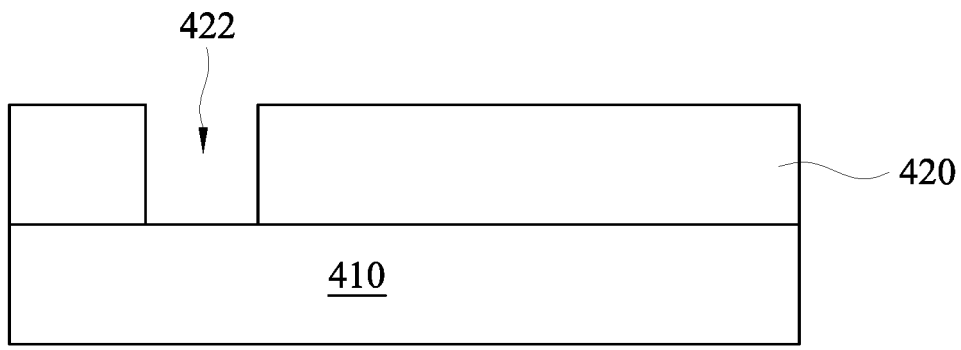
Figure 4C:
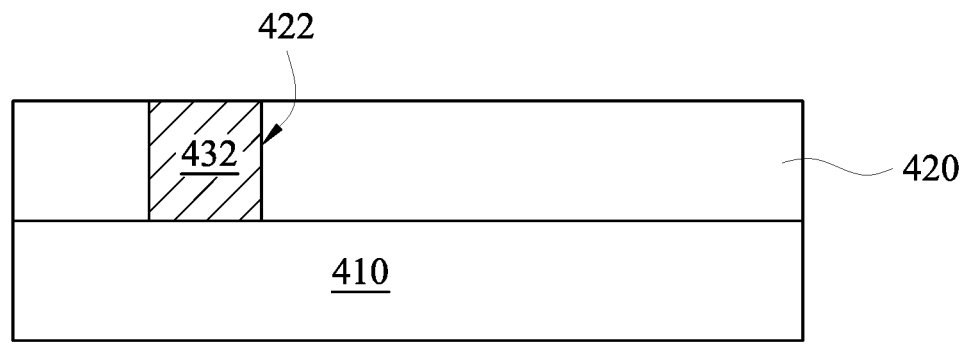

Then, as shown in FIG. 4B, a through hole 422 is formed in the first dielectric layer 420 by an etch process, and a portion of a top surface of the substrate layer 410 is exposed from the through hole 422. The etch process may be a dry etching process. Next, as shown in FIG. 4C, the through hole 422 is filled with tungsten to form a tungsten conductive via 432. The through hole 422 is filled using a deposition process such as CVD, PVD, plating or the like. In some embodiments, a chemical mechanical polishing (CMP) process may be further performed to remove excess tungsten, and a surface of the tungsten conductive via 432 is level with a surface of the first dielectric layer 420.

Figure 4D:
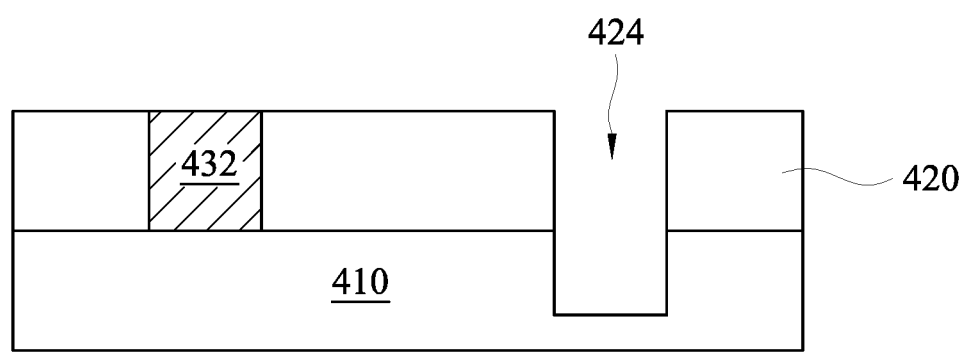

Next, as shown in FIG. 4D, an opening 424 is formed through the first dielectric layer 420, and the opening 424 extends into a portion of the substrate layer 410. The opening 424 may be formed by forming a hardmask layer (not shown), forming a patterned photoresist layer (not shown), etching the hardmask layer and the first dielectric layer 420 by a wet etching or a dry etching using the patterned photoresist layer as a mask, and etching a portion of the substrate layer 410 using the hardmask as a mask to form the opening 424. The above processes are known in the art and may not be described in detailed herein.

Figure 4E:
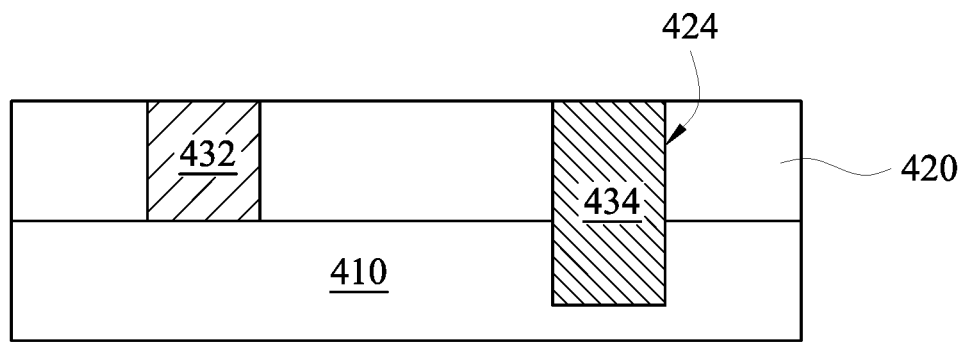

Then, as shown in FIG. 4E, the opening 424 is filled with copper to form a copper conductive via 434. The opening 424 may be filled using a deposition process such as CVD, PVD, plating or the like. In some embodiments, a CMP process may be further performed to remove excess copper, and a surface of the copper conductive via 434 is level with the surface of the first dielectric layer 420.

Figure 4F:
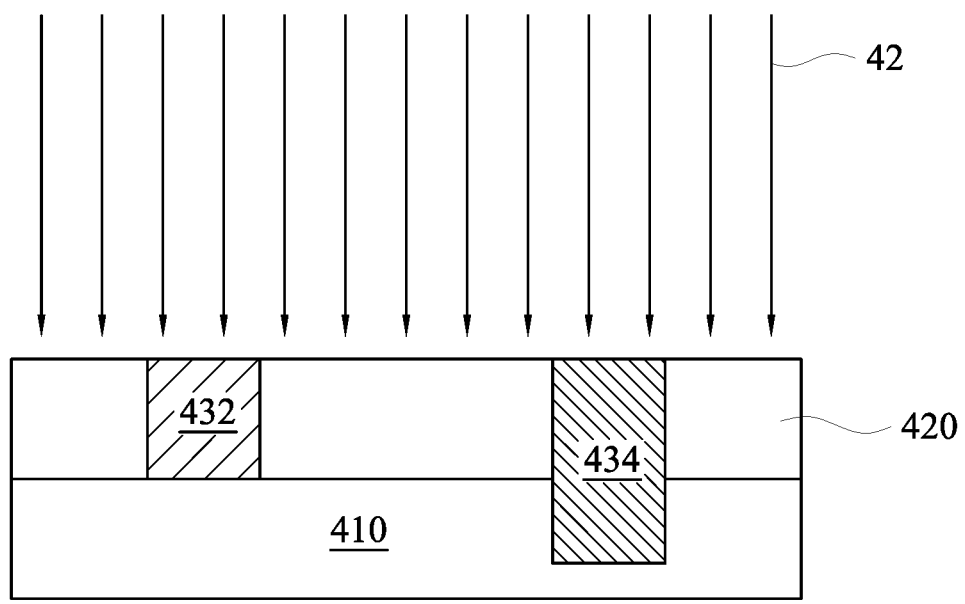

Referring to FIG. 4F, a nitrogen pre-treatment 40 is performed on the surfaces of the tungsten conductive via 432, the copper conductive via 434 and the first dielectric layer 420. The nitrogen pre-treatment 40 is similar to the nitrogen pre-treatment 20 of FIG. 2A.

Figure 4G:
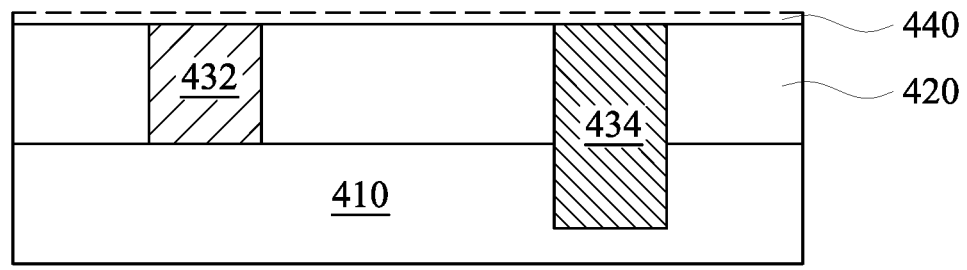

Next, as shown in FIG. 4G, a pre-layer 440 is formed on the tungsten conductive via 432, the copper conductive via 434 and the first dielectric layer 420. The formation of the pre-layer 440 of FIG. 4G is similar to the formation of the pre-layer 240 of FIG. 2C.

Figure 4H:
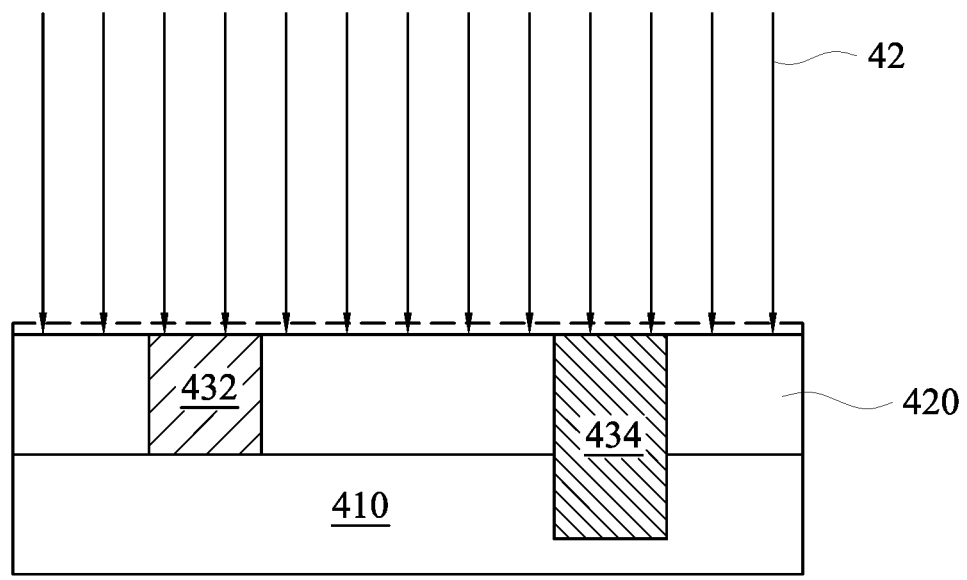
Figure 4I:
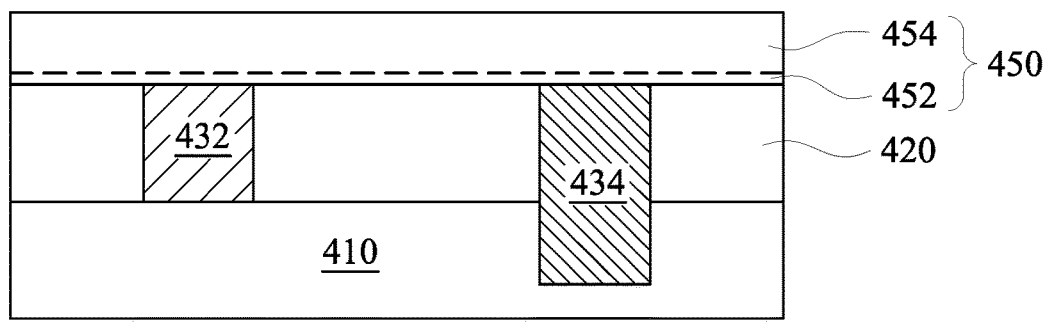

Afterwards, as shown in FIG. 4H, an operation 42 is performed on the tungsten conductive via 432, the copper conductive via 434 and the first dielectric layer 420, thereby forming an etch stop layer 450 of FIG. 4I. The operation 42 and the etch stop layer 450 of FIG. 4H and FIG. 4I are respectively similar to the operation 22 and the etch stop layer 250 of FIG. 2C and FIG. 2D. In addition, a first portion 452 and a second portion 454 of the etch stop layer 450 of FIG. 4I are also similar to the first portion 252 and a second portion 254 of the etch stop layer 250 of FIG. 2D and may not be repeated herein.

Figure 4J:
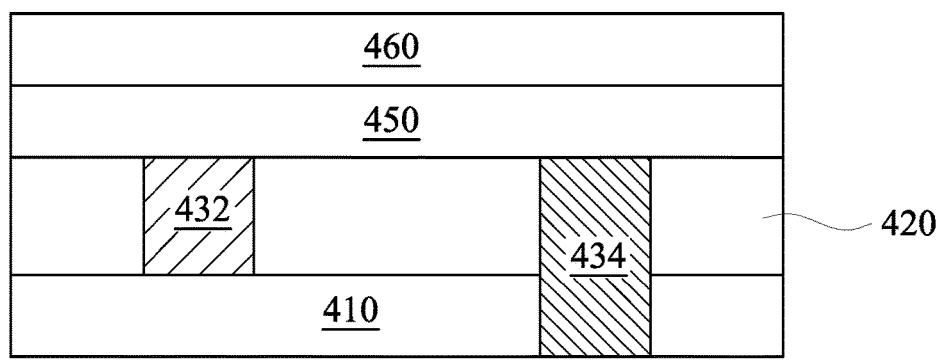

In further embodiments, a second dielectric layer 460 may be deposited on the etch stop layer 450. Accordingly, a semiconductor structure 400 is then formed, as shown in FIG. 4J. The formation of the second dielectric layer 460 in FIG. 4J is similar to the formation of the second dielectric layer 260 in FIG. 2E. In some embodiments, a thinning process may be further performed on the back surface of the substrate layer 410, so as to expose one end of the copper conductive via 434. This may be done, for example, through grinding, etching, and/or polishing, resulting in a thinned substrate with a predetermined thickness depending on various purposes. In some embodiments, the copper conductive via 434 may be exposed from the back surface of the substrate layer 410 for a sensing purpose. In some embodiments, the semiconductor structure 400 may be used as an interconnect structure to connect two devices. In alternative embodiments, the exposed copper conductive via 434 may be covered by another dielectric layer (not shown) for connecting the semiconductor structure 400 to another semiconductor structure or device (not shown). In such embodiments, a backside metallization process may be further performed. The backside metallization including electrical connections and/or other structures are formed on the back surface of the thinned substrate, including a backside dielectric layer and bonding pads (not shown) for connecting external dies or a wafer.

It is noted that dotted lines are illustrated between the first portion (e.g. 142, 252, 352 or 452) and the second portion (e.g. 144, 254, 354 or 454), as shown in FIG. 1, FIG. 2D, FIG. 2E, FIG. 3 or FIG. 4I, in which the dotted lines represent the first portions 142, 252, 352 or 452 may not have clear border lines with their respective second portions 144, 254, 354 or 454 in actual situations. In fact, each of the etch stop layers 140, 250, 350 and 450 is one single layer formed in one single deposition process.

Figure 5A:
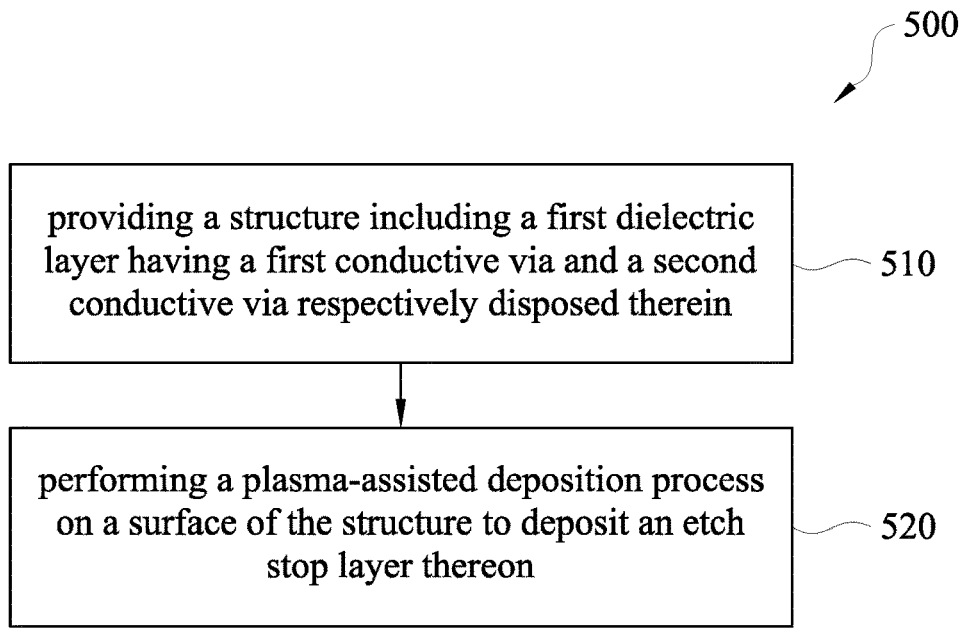
FIG. 5A and FIG. 5B are flow charts showing a method of forming a semiconductor structure having an etch stop layer in accordance with some embodiments of the present disclosure.
Figure 5B:
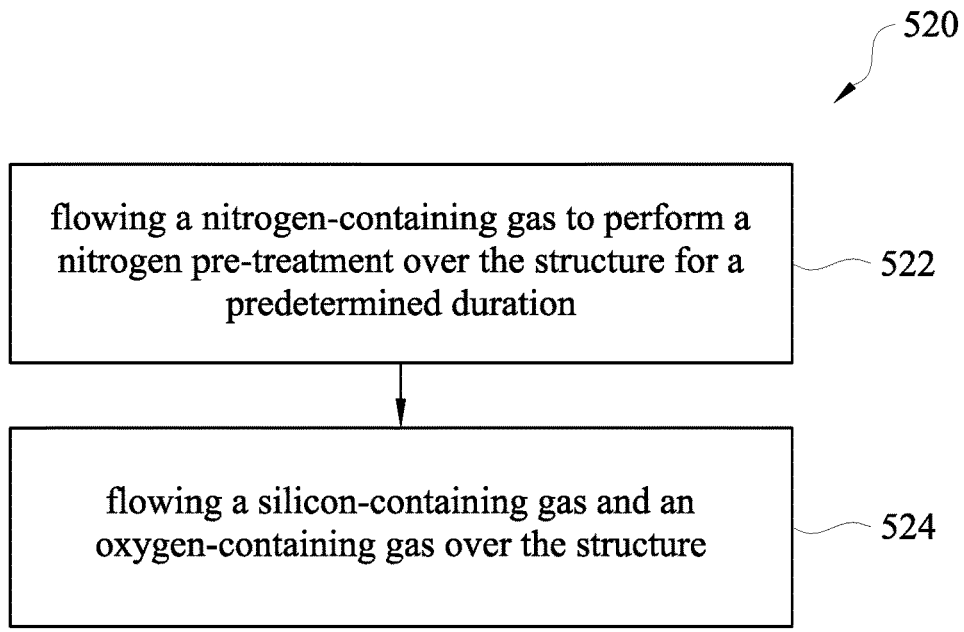

FIG. 5A and FIG. 5B are flow charts showing a method 500 of forming a semiconductor structure having an etch stop layer in accordance with some embodiments of the present disclosure. FIG. 2A through FIG. 2D are incorporated for explanation. The sequence of the operations in the method 500 depicted in FIG. 5A is for illustration only; the operations of the method 500 may be performed in sequences that differ from that depicted in FIG. 5A. Operations in addition to those depicted in FIG. 5A may be performed before, between and/or after the operations depicted in FIG. 5A. As shown in FIG. 5A, the method 500 includes operations 510 and 520, and operation 520 further includes operations 522 and 524 as shown in FIG. 5B. At operation 510, a structure is provided, and the structure includes a first dielectric layer having a first conductive via and a second conductive via respectively disposed therein, for example, the structure 210, the first dielectric layer 220, the first conductive via 232 and the second conductive via 234 of FIG. 2A.

At operation 520, a plasma-assisted deposition process is performed on a surface of the structure to deposit an etch stop layer thereon, for example the etch sop layer 250 of FIG. 2D. Detailed descriptions are provided in operations 522 and 524 of FIG. 5B. At operation 522, a nitrogen-containing gas flows to perform a nitrogen pre-treatment over the structure for a predetermined duration, for example, the nitrogen pre-treatment 20 of FIG. 2A. And then, the pre-layer 240 of FIG. 2B may be formed. At operation 524, a silicon-containing gas and an oxygen-containing gas flow over the structure, for example, as shown in operation 22 of FIG. 2C. Accordingly, the etch stop layer 250 of FIG. 2D is formed.

The present disclosure provides a semiconductor structure having an etch stop layer and a method of forming the same. The etch stop layer includes nitrogen-and-oxygen-doped silicon carbide (NODC). The etch stop layer has a first portion and a second portion disposed on the first portion, in which the nitrogen content of the first portion is greater than the nitrogen content of the second portion. The first portion is formed by a nitrogen pre-treatment, followed by flowing a silicon-containing gas and an oxygen-containing gas. The etch stop layer has improved adhesion to both a metal layer (e.g. copper or tungsten) and a dielectric layer.

According to some embodiments of the present disclosure, a semiconductor structure having an etch stop layer is provided. The semiconductor structure includes a first dielectric layer, a first conductive via, a second conductive via and an etch stop layer. The first conductive via and the second conductive via are respectively disposed in the first dielectric layer. The etch stop layer is disposed on the first dielectric layer and contacts the first and second conductive vias. The etch stop layer includes nitrogen-and-oxygen-doped silicon carbide (NODC).

According to some embodiments of the present disclosure, a method of forming a semiconductor structure having an etch stop layer is provided. The method includes the following operations. First, a structure including a first dielectric layer is provided, in which a first conductive via and a second conductive via are respectively disposed in the first dielectric layer. Then, a plasma-assisted deposition process is performed on a surface of the structure to deposit an etch stop layer thereon. The plasma-assisted deposition process includes flowing a nitrogen-containing gas to perform a nitrogen pre-treatment over the structure for a predetermined duration; and flowing a silicon-containing gas and an oxygen-containing gas over the structure.

According to some embodiments of the present disclosure, a semiconductor structure having an etch stop layer is provided. The semiconductor structure includes a substrate layer, a first dielectric layer, a tungsten conductive via, a copper conductive via and an etch stop layer. The first dielectric layer is disposed on the substrate layer. The tungsten conductive via is disposed in the first dielectric layer. The copper conductive via is disposed in the first dielectric layer and extending through the substrate layer. The etch stop layer is disposed on the first dielectric layer and contacts the tungsten conductive via and the copper conductive via. The etch stop layer includes NODC. The etch stop layer has a first portion and a second portion disposed on the first portion, and a nitrogen content of the first portion is greater than a nitrogen content of the second portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure having an etch stop layer, the semiconductor structure comprising:
    a first dielectric layer;
    a first conductive via and a second conductive via respectively disposed in the first dielectric layer; and
    an etch stop layer disposed on the first dielectric layer and contacting the first and second conductive via, wherein the etch stop layer comprises nitrogen-and-oxygen-doped silicon carbide (NODC), and the etch stop layer has a first portion and a second portion disposed on the first portion, and a nitrogen content of the first portion is greater than a nitrogen content of the second portion.

2. The semiconductor structure of claim 1, further comprises a second dielectric layer over the etch stop layer.

3. The semiconductor structure of claim 2, wherein the first and second dielectric layers respectively comprise phosphosilicate glass (PSG), fluorosilicate glass (FSG), undoped silicate glass (USG), hard black diamond (HBD), extreme low k (ELK) dielectrics, high-stress undoped silicate glass (HSUSG) or a combination thereof.

4. The semiconductor structure of claim 1, wherein a material forming the first conductive via comprises tungsten, tungsten-based alloys, copper, copper-based alloys or combinations thereof, and a material forming the second conductive via comprises copper, copper-based alloy, tungsten, aluminum, gold, silver or a combination thereof.

5. The semiconductor structure of claim 1, wherein a thickness of the first portion is substantially no more than 20 Å.

6. The semiconductor structure of claim 1, wherein the nitrogen content of the first portion is in a range substantially from 5 atomic percent (at. %) to 10 at. %.

7. A method of forming a semiconductor structure having an etch stop layer comprising a first portion and a second portion, wherein a nitrogen content of the first portion is greater than a nitrogen content of the second portion, the method comprising:
    providing a structure comprising a first dielectric layer, wherein a first conductive via and a second conductive via are respectively disposed in the first dielectric layer; and
    performing a plasma-assisted deposition process on a surface of the structure to deposit an etch stop layer thereon, the plasma-assisted deposition process comprising:
        flowing a nitrogen-containing gas to perform a nitrogen pre-treatment over the structure for a predetermined duration; and
        flowing a silicon-containing gas and an oxygen-containing gas over the structure, wherein a first portion of the etch stop layer is formed by reacting the nitrogen-containing gas with the silicon-containing gas and the oxygen-containing gas.

8. The method of claim 7, further comprising depositing a second dielectric layer on the etch stop layer.

9. The method of claim 7, wherein the predetermined duration is substantially no less than 15 seconds.

10. The method of claim 7, wherein the nitrogen-containing gas comprises ammonia ($NH_3$).

11. The method of claim 7, wherein the silicon-containing gas comprises tetramethylsilane ($Si(CH_3)_4$), trimethylsilane ($SiH(CH_3)_3$) or a combination thereof.

12. The method of claim 7 wherein the oxygen-containing gas comprises carbon dioxide (CO2), oxygen (O2) or a combination thereof.

13. The method of claim 7, wherein the plasma-assisted deposition process is a plasma enhanced chemical vapor deposition (PECVD) process.

14. The method of claim 7, wherein flowing the silicon-containing gas and the oxygen-containing gas over the structure further comprises reacting the silicon-containing gas with the oxygen-containing gas, thereby forming a second portion of etch stop layer on the first portion.

15. The method of claim 7, further comprising depositing a second dielectric layer on the etch stop layer after the etch stop layer is deposited.

16. The method of claim 15, wherein the structure comprises a substrate layer under the first dielectric layer, and the second conductive via extends into the substrate layer, and the method further comprises:
    performing a thinning process on a back surface of the substrate layer, thereby exposing the second conductive via, wherein the back surface is opposite to a surface on which the first dielectric layer is disposed.

17. A semiconductor structure having an etch stop layer, the semiconductor structure comprising:
    a substrate layer;

a first dielectric layer disposed on the substrate layer;
a tungsten conductive via disposed in the first dielectric layer;
a copper conductive via disposed in the first dielectric layer and extending through the substrate layer; and
an etch stop layer disposed on the first dielectric layer and contacting the tungsten conductive via and the copper conductive via, the etch stop layer comprising NODC, wherein the etch stop layer has a first portion and a second portion disposed on the first portion, and a nitrogen content of the first portion is greater than a nitrogen content of the second portion.

18. The semiconductor structure of claim 17, wherein the nitrogen content of the first portion is in a range from substantially 5 at. % to 10 at. %.

19. The semiconductor structure of claim 17, further comprises a second dielectric layer on the etch stop layer.

* * * * *